(12) United States Patent
Parris

(10) Patent No.: US 6,512,394 B1
(45) Date of Patent: Jan. 28, 2003

(54) TECHNIQUE FOR EFFICIENT LOGIC POWER GATING WITH DATA RETENTION IN INTEGRATED CIRCUIT DEVICES

(75) Inventor: Michael C. Parris, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/098,872

(22) Filed: Mar. 14, 2002

(51) Int. Cl.[7] ............... H03K 17/16; H03K 19/003; G05F 3/02

(52) U.S. Cl. ............... 326/34; 326/33; 327/530; 365/226

(58) Field of Search ............... 326/31, 33, 34, 326/83; 327/530, 535, 537, 538; 365/226, 227, 228, 229

(56) References Cited

U.S. PATENT DOCUMENTS 5,726,946 A * 3/1998 Yamagata et al. .......... 365/226
5,801,576 A * 9/1998 Ooishi .................. 327/530
5,973,552 A    10/1999 Allan
6,384,674 B2 *  5/2002 Tanizaki et al. ........... 327/544

OTHER PUBLICATIONS

Kumagai, Kouichi; Hiroaki, Iwaki; Yoshida, Hiroshi; Suzuki, Hisamitsu; Yamada, Takashi; Kurosawa, Susumu; "A Novel Powering–down Scheme for Low Vt CMOS Circuits," ULSI Device Development Laboratories, NEC Corporation, 1998 Symposium on VLSI Circuits Digest of Technical Papers, pp. 44–45.

Yamagata, Tadato; Tomishima, Shigeki; Tsukude, Masaki; Hashizume, Yasushi; Arimoto Kazutami; "Circuit Design Techniques for Low–Voltage Operating and/or Giga–Scale DRAMs", ULSI Laboratory, Mitsubishi Electric Corporation, 1995 IEEE, pp. 248–249.

* cited by examiner

Primary Examiner—Daniel D. Chang
(74) Attorney, Agent, or Firm—William J. Kubida; Peter J. Meza; Hogan & Hartson LLP

(57) ABSTRACT

A logic circuit has two internal voltage lines and includes additional upper and lower MOS transistors for coupling the external voltage supplies to the internal voltage nodes instead of using a single diode or transistor. These additional devices serve to clamp the internal voltages to a level that minimizes leakage current and maintains the data in the logic circuits.

23 Claims, 4 Drawing Sheets

TECHNIQUE FOR EFFICIENT LOGIC POWER GATING WITH DATA RETENTION IN INTEGRATED CIRCUIT DEVICES

BACKGROUND OF THE INVENTION

The present invention relates, in general, to the field of integrated circuit ("IC") devices. More particularly, the present invention relates to a technique for efficient logic power gating with data retention for IC devices that have "active" and "standby" modes of operation.

Power gating peripheral logic blocks for IC memory devices are known. To date, attempts to reduce the leakage current for these circuits have exhibited two significant problems. First, even with extra power gating, the leakage current is still unacceptably high. Secondly, the state of the logic devices, latches, flip-flops, registers and the like is lost during the "standby", or power-gated, mode.

U.S. Pat. No. 5,973,552 attempts to address the former problem by raising the gate voltage of the power gating devices to a boosted voltage level. This is effective in reducing the undesired current leakage (subthreshold current) of these devices but is a cumbersome process. The specification of this particular patent further describes a means for effectuating this end that minimizes the charge consumed out of the Vbb or Vpp supplies through the addition of more circuitry.

As to the latter problem, an article entitled "A Novell Powering-down Scheme for Low Vt CMOS Circuits" published in the 1998 Symposium on VLSI Circuits Digest of Technical Papers by Kumagai et al. outlines a way to maintain the logic states of power-gated logic that fails to work for low voltage complementary metal oxide semiconductor ("CMOS") circuits. As described, the article particularly illustrates the use of PN diodes to clamp the internal power supplies to within a diode drop of the external power supplies. While this approach may be acceptable with respect to circuits which operate in the range of 1.5 volts, it fails to function for ultra low voltage designs in the range of 0.8 volts or lower.

Another article by Yamagata et al., "Circuit Design Techniques for Low-Voltage Operating and/or Giga-Scale DRAMs" published in the 1995 IEEE International Solid-State Circuits Conference (ISSCC) at pp. 248–249 illustrates logic transistor bodies tied to external supplies for different reasons such as the speed of entering and leaving a standby mode and not for the purpose of reducing current leakage in a standby mode.

SUMMARY OF THE INVENTION

The technique for efficient logic power gating with data retention for IC devices that have "active" and "standby" modes of operation in accordance with the present invention disclosed herein overcomes both of the aforementioned problems encountered in conventional approaches.

By way of background, the threshold voltage ("Vt")of a metal oxide semiconductor ("MOS") transistor is known to be affected by the voltage which is applied to the back contact, or "back gate". The voltage difference between the source and the bulk ("$V_{BS}$") changes the width of the depletion layer and, therefore, also the voltage across the oxide due to the change of the charge in the depletion region. This is known as the "body effect", or substrate bias effect, and stated another way, it is the variation of the threshold voltage of an MOS transistor due to a variation of the substrate or bulk voltage to the back contact.

In accordance with the technique of the present invention, the first mentioned problem inherent in prior approaches is solved using external voltage supplies ("$VCC_{EXT}$" and "$VSS_{EXT}$"), wherein the Vt of the MOS devices is unaltered during "active" modes of operation when $VCC_{ext}=VCC_{int}$ and $VSS_{ext}=VSS_{int}$ (where "$VCC_{INT}$" and "$VSS_{INT}$" are the voltages on internal supply nodes) but the Vt will rise, reducing leakage, during "standby" mode when $VCC_{int}$ and $VSS_{int}$ drift towards each other due to the increased body effect. This constitutes, in essence, a positive feedback effect wherein, the more the logic devices leak, the more the internal voltage supplies will collapse, which increases the back gate voltage.

The latter identified problem of conventional designs is then overcome by using additional upper and lower MOS transistors nodes instead of PN diodes for coupling the external voltage supplies to the internal voltage. These additional devices serve to clamp the internal voltages to a level that will maintain the data in the logic circuits, since the Vt of the transistors can be made to be much less than 0.7 volts, the built in voltage of a diode.

Particularly disclosed herein is an integrated circuit logic device having supply and reference voltage input lines thereof. The integrated circuit device comprises an internal supply voltage node which is selectively couplable to the supply voltage line in response to an input signal supplied to a gate terminal of a first MOS transistor. An internal reference voltage node is also selectively couplable to the reference voltage line in response to a complement of the input signal supplied to a gate terminal of a second MOS transistor. A third MOS transistor is coupled in parallel with the first MOS transistor between the supply voltage line and the internal supply voltage node and has a gate terminal coupled to the supply voltage line and a back gate coupled to the internal supply voltage node. A fourth MOS transistor is coupled in parallel with the second MOS transistor between the reference voltage line and the internal reference voltage node and has a gate terminal coupled to the reference voltage line and a back gate coupled to the internal reference voltage node. A logic circuit comprising a plurality of logic gates is coupled between the internal supply voltage node and the internal reference voltage node.

Also disclosed herein is an integrated circuit device comprising a plurality of logic gates coupled between an internal supply voltage node and an internal reference voltage node. First and second parallel coupled MOS transistors couple a supply voltage line to the internal supply voltage node and third and fourth parallel coupled MOS transistors couple a reference voltage line to the internal reference voltage node. First and second complementary input lines are respectively coupled to gate terminals of the first and third MOS transistors while gate terminals of the second and fourth MOS transistors are coupled to the supply voltage line and the reference voltage line respectively.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
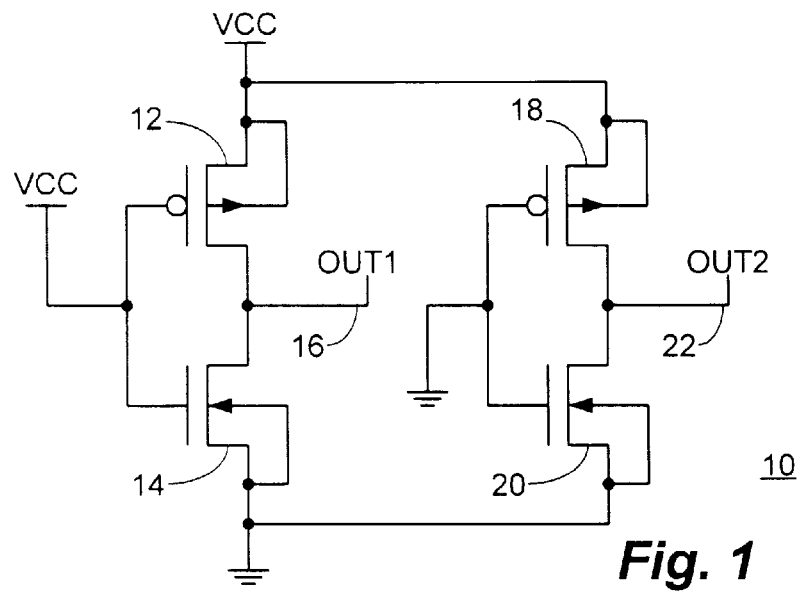
FIG. 1 illustrates a generalized view of a conventional complementary metal oxide semiconductor ("CMOS") logic circuit illustrated, for simplicity sake, as a pair of very large series coupled P-channel and N-channel transistors connected in parallel with each other and coupled between a supply voltage source ("VCC") and a reference voltage level of circuit ground ("VSS")

With reference now to FIG. 1, a generalized illustration of a conventional prior art CMOS logic circuit 10 is shown. The circuit 10 is illustrated in a generalized way as comprising a pair of series coupled transistors including P-channel transistor 12 together with N-channel transistor 14 and P-channel transistor 18 together with N-channel transistor 20 connected in parallel with each other and coupled between a supply voltage source ("VCC") and a reference voltage level of circuit ground ("VSS").

The transistors 12, 14, 18 and 20 are intended to represent thousands of random logic gates located, for example, in the periphery of a dynamic random access memory ("DRAM") circuit wherein approximately half of the devices will have their inputs tied to a logic level "high" (as in the case of transistors 12 and 14) and half will have their inputs tied to a logic level "low" (as in the case of transistors 18 and 20). For purposes of this illustration, transistor 12 is ascribed a width/length ratio of 100000$\mu$/0.18$\mu$; transistor 14 has a width/length ratio of 50000$\mu$/0.18$\mu$; transistor 18 has a width/length ratio of 100000$\mu$/0.18$\mu$ and transistor 20 has a width/length ratio of 50000$\mu$/0.18$\mu$.

In this generalized view, the common connected gate terminals of transistors 12 and 14 are coupled to VCC while the common connected gate terminals of transistors 18 and 20 are coupled to VSS. The node intermediate transistors 12 and 14 defines a first circuit output 16 ("OUT1") while the node intermediate transistors 18 and 20 defines a second circuit output 22 ("OUT2"). As shown, the back gates of the P-channel transistors 12, 18 are coupled to VCC while the back gates of the N-channel transistors 14, 20 are coupled to VSS.

Figure 2:
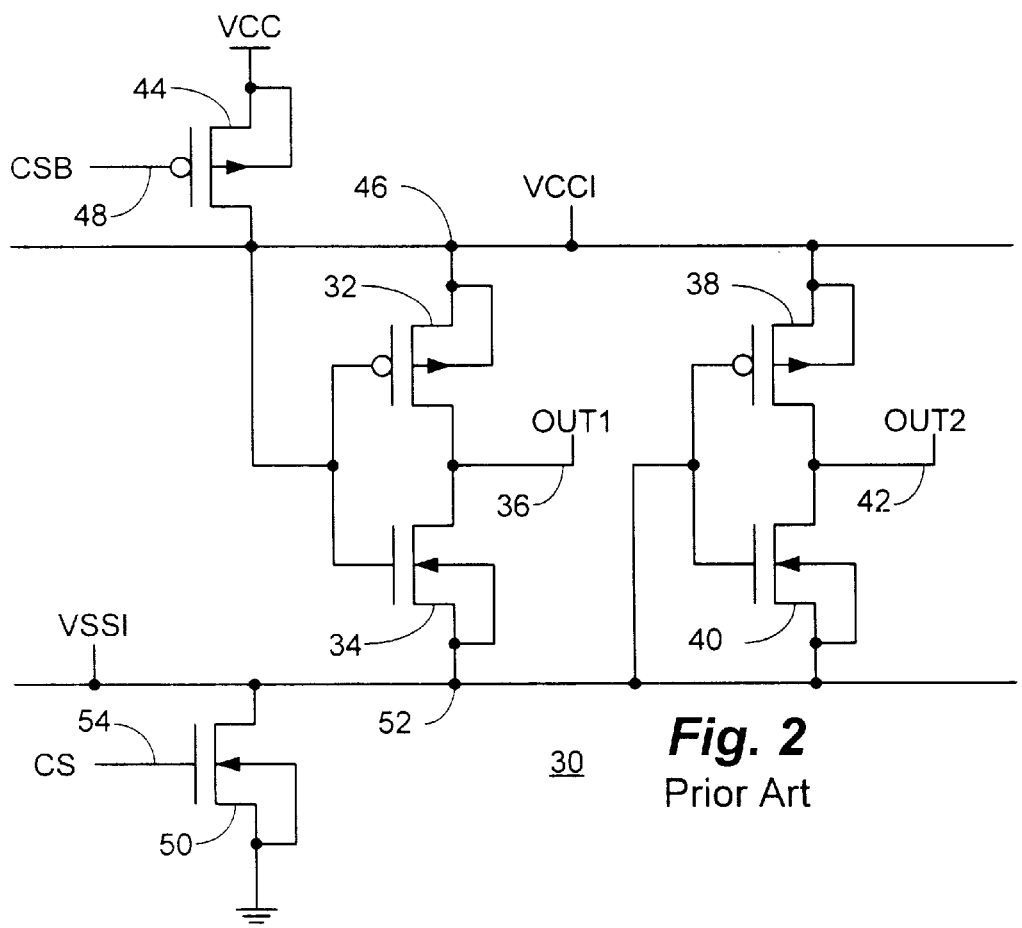
FIG. 2 illustrates an alternative embodiment of a conventional CMOS logic circuit which comprises the simplified circuit representation of FIG. 1 but wherein the parallel connected, series coupled transistor pairs are instead selectively coupled between an internal supply voltage node ("VCC$_{INT}$" or "VCCI") and an internal reference voltage node ("VSS$_{INT}$" or "VSSI"), which nodes are powered in response to complementary chip select signals ("CSB" and "CS") respectively supplied to the gate terminal of a single upper P-channel transistor coupling the VCCI node to VCC, and a single lower N-channel transistor coupling the VSSI node to VSS.

With reference additionally now to FIG. 2, an alternative embodiment of a generalized, conventional CMOS logic circuit 30 is shown. The circuit 30 comprises, in pertinent part, the circuit 10 of FIG. 1 including a pair of representative series coupled transistors here indicated as P-channel transistor 32 together with N-channel transistor 34 and P-channel transistor 38 together with N-channel transistor 40 connected in parallel with each other and coupled instead between an internal supply voltage node 46 ("VCCI") and an internal reference voltage node 52 ("VSSI"). The common connected gate terminals of transistors 32 and 34 are represented as being coupled to VCCI while the common connected gate terminals of transistors 38 and 40 are coupled to VSSI.

The node intermediate transistors 32 and 34 defines a first circuit output 36 ("OUT1") while the node intermediate transistors 38 and 40 defines a second circuit output 42 ("OUT2"). As shown, the back gates of the P-channel transistors 32, 38 are coupled to t he VCCI node 46 while the back gates of the N-channel transistors 34, 40 are coupled to the VSSI node 52.

An upper P-channel transistor 44, with its back gate tied to VCC, selectively couples the VCCI node 46 to VCC in response to a chip select bar ("CSB") signal on line 48. Also, a corresponding lower N-channel transistor 50, with its back gate tied to VSS, selectively couples the VSSI node 52 to VSS in response to a complementary chip select ("CS") signal on line 54. In this generalized representation, transistor 44 has a representative width/length ratio of 2000$\mu$/0.18$\mu$ and transistor 50 has a width/length ratio of 1000$\mu$/0.18$\mu$.

Figure 3:
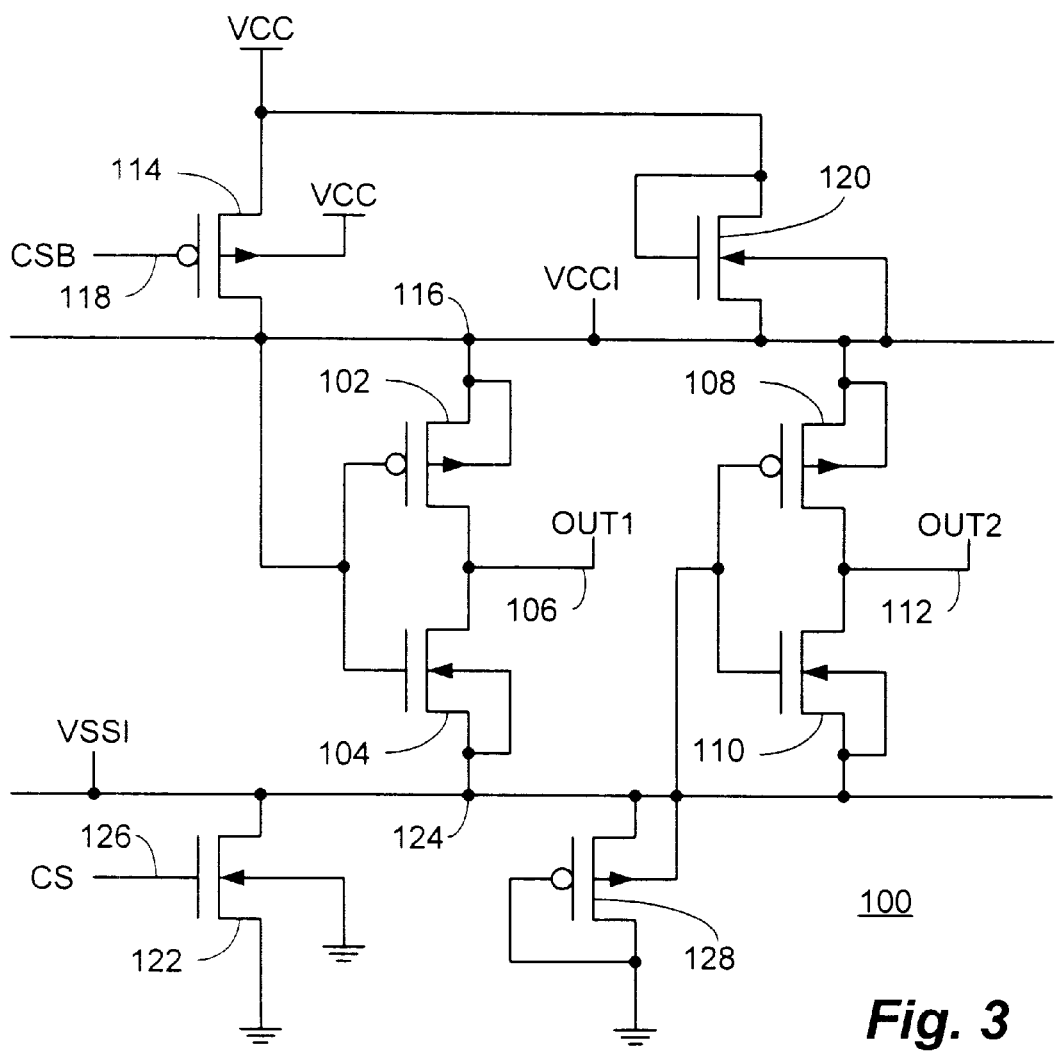
FIG. 3 illustrates an embodiment of a CMOS logic circuit in accordance with the technique of the present invention which also comprises the representative circuit of FIG. 1 and wherein the generalized representation of parallel connected, series coupled transistor pairs are selectively coupled between the VCCI and VSSI nodes, which nodes are powered in response to the complementary signals CSB and CS respectively supplied to the gate terminal of an upper P-channel transistor connected in parallel with an additional N-channel transistor coupling the VCCI node to VCC and a lower N-channel transistor connected in parallel with an additional P-channel transistor coupling the VSSI node to VSS.

With reference additionally now to FIG. 3, an embodiment of a circuit 100 in accordance with the technique of the present invention is shown. The circuit 100 also comprises, in pertinent part and for purposes of illustration, the conventional CMOS logic circuit 10 of FIG. 1 including the same representative pair of series coupled transistors here indicated as P-channel transistor 102 together with N-channel transistor 104 and P-channel transistor 108 together with N-channel transistor 110 connected in parallel with each other and coupled instead between a VCCI node 116 and a VSSI node 124. The common connected gate terminals of transistors 102 and 104 are still coupled to VCCI while the common connected gate terminals of transistors 108 and 110 remain coupled to VSSI.

The node intermediate transistors 102 and 104 defines a first circuit output 106 ("OUT1") while the node intermediate transistors 108 and 110 defines a second circuit output 112 ("OUT2"). As shown, the back gates of the P-channel transistors 102, 108 are coupled to the VCCI node 116 while the back gates of the N-channel transistors 104, 110 are coupled to the VSSI node 124.

An upper P-channel transistor 114, with its back gate tied to VCC, selectively couples the VCCI node 116 to VCC in response to a chip select bar ("CSB") signal on line 118. An additional upper N-channel transistor 120, with its gate terminal coupled to VCC and its back gate coupled to the VCCI node 116, is coupled in parallel with transistor 114. In addition, a lower N-channel transistor 122, with its back gate tied to VSS, selectively couples the VSSI node 124 to VSS in response to a complementary chip select ("CS") signal on line 126. An additional P-channel transistor 128, with its gate terminal coupled to VSS and its back gate coupled to the VSSI node 124, is coupled in parallel with transistor 122.

Transistors 120 and 128 serve to clamp the internal voltages on the VCCI node 116 and the VSSI node 124 respectively to a level that will maintain the data in the logic circuits. This is due to the fact that the Vt of these can be made to be much less than 0.7 volts, the built in voltage of a diode. The body connections of transistors 120 and 128 back to the corresponding VCCI node 116 and VSSI node 124 respectively serve to lower their Vt. If the voltages involved are low enough, this connection can be made to VCC for transistor 120 and to VSS for transistor 128. Moving the body connection further reduces the Vt of these devices.

Figure 4:
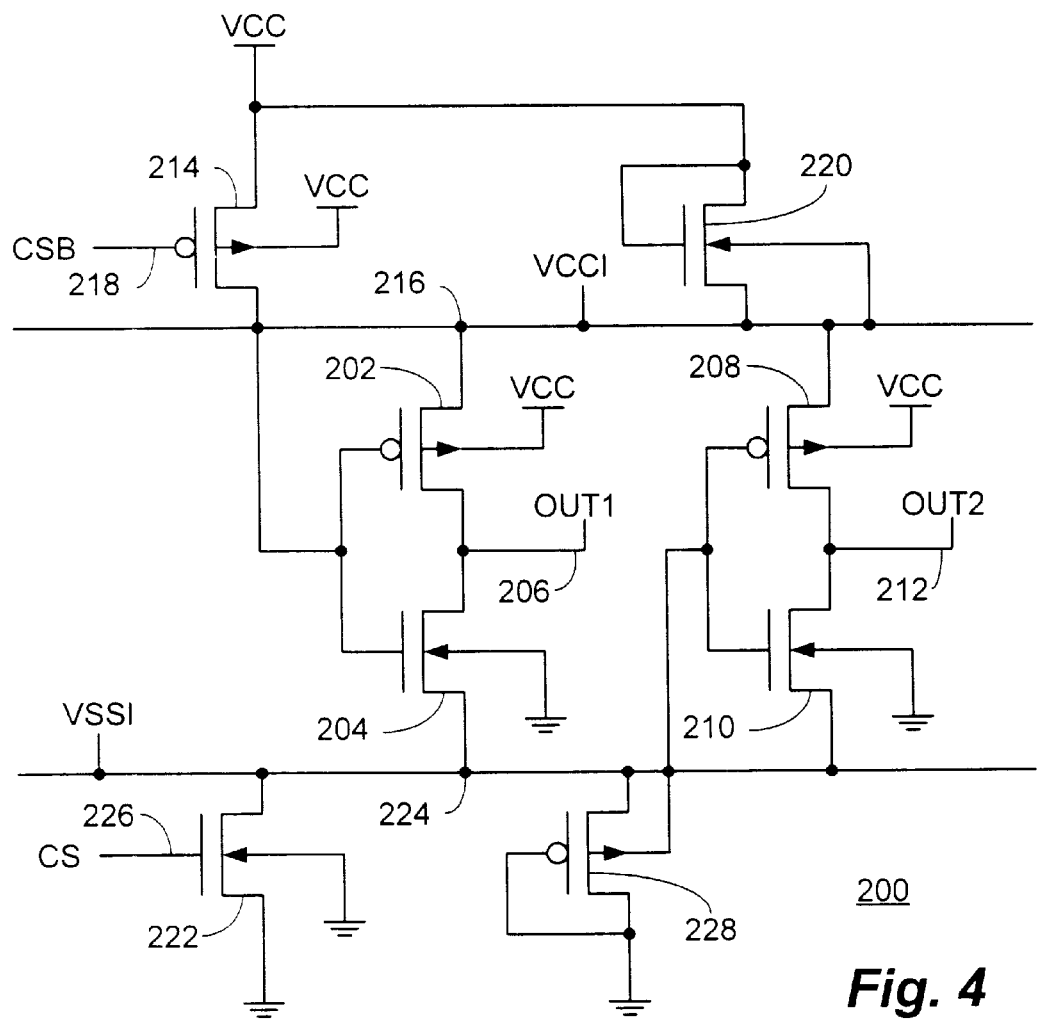
FIG. 4 illustrates an alternative embodiment of a CMOS logic circuit in accordance with the technique of the present invention similar to that shown in FIG. 3 but and wherein the generalized P-channel transistors of the parallel connected, series coupled transistor pairs have their back gate tied to VCC instead of VSSI while the corresponding generalized N-channel transistors have their back gate tied to VSS instead of VSSI.

With reference additionally now to FIG. 4, an alternative embodiment of a circuit 200 in accordance with the technique of the present invention is shown. The circuit 200 is similar to that shown in FIG. 3 but the P-channel transistors of the parallel connected, series coupled transistor pairs have their back gate tied to VCC instead of VSSI while the corresponding N-channel transistors have their back gate tied to VSS instead of VSSI.

As shown again in a generalized, representative way, a P-channel transistor 202 together with N-channel transistor 204 and P-channel transistor 208 together with N-channel transistor 210 define series coupled transistor pairs which are connected in parallel with each other and coupled between a VCCI node 216 and a VSSI node 224. The common connected gate terminals of transistors 202 and 204 are coupled to VCCI while the common connected gate terminals of transistors 208 and 210 are coupled to VSSI. The node intermediate transistors 202 and 204 defines a first circuit output 206 ("OUT1") while the node intermediate transistors 208 and 210 defines a second circuit output 212 ("OUT2"). As shown, the back gates of the P-channel transistors 202, 208 are coupled to VCC (instead of the VCCI node 216) while the back gates of the N-channel transistors 204, 210 are coupled to VSS (instead of the VSSI node 224).

Similarly to the embodiment shown in the preceding figure, an upper P-channel transistor 214, with its back gate tied to VCC, selectively couples the VCCI node 216 to VCC in response to a chip select bar ("CSB") signal on line 218. An additional upper N-channel transistor 220, with its gate terminal coupled to VCC and its back gate coupled to the VCCI node 216, is coupled in parallel with transistor 214. In addition, a lower N-channel transistor 222, with its back gate tied to VSS, selectively couples the VSSI node 224 to VSS in response to a complementary chip select ("CS") signal on line 226. An additional P-channel transistor 228, with its gate terminal coupled to VSS and its back gate coupled to the VSSI node 224, is coupled in parallel with transistor 222. Transistors 220 and 228 function in substantially the same manner as previously described with respect to transistors 120 and 128 in the preceding figure.

In the exemplary embodiment illustrated and described, the following representative device dimensions have been chosen to represent thousands of logic gates of a conventional CMOS integrated circuit device wherein approximately half will have their inputs tied to a logic level "high" and half will have their inputs tied to a logic level "low". With this in mind, in the generalized circuit shown: transistor 202 is ascribed a width/length ratio of $100000\mu/0.18\mu$; transistor 204 a width/length ratio of $50000\mu/0.18\mu$; transistor 208 a width/length ratio of $100000\mu/0.18\mu$; and transistor 210 a width/length ratio of $50000\mu/0.18\mu$. Transistor 214 may have a width/length ratio of substantially $2000\mu/0.18\mu$; transistor 220 a width/length ratio of $10\mu/0.18\mu$; transistor 222 a width length ratio of $1000\mu/0.18\mu$; and transistor 228 has a width/length ratio of $40\mu/0.18\mu$. Corresponding representative devices in the embodiment of FIG. 3 are of similar dimensions.

Figure 5:
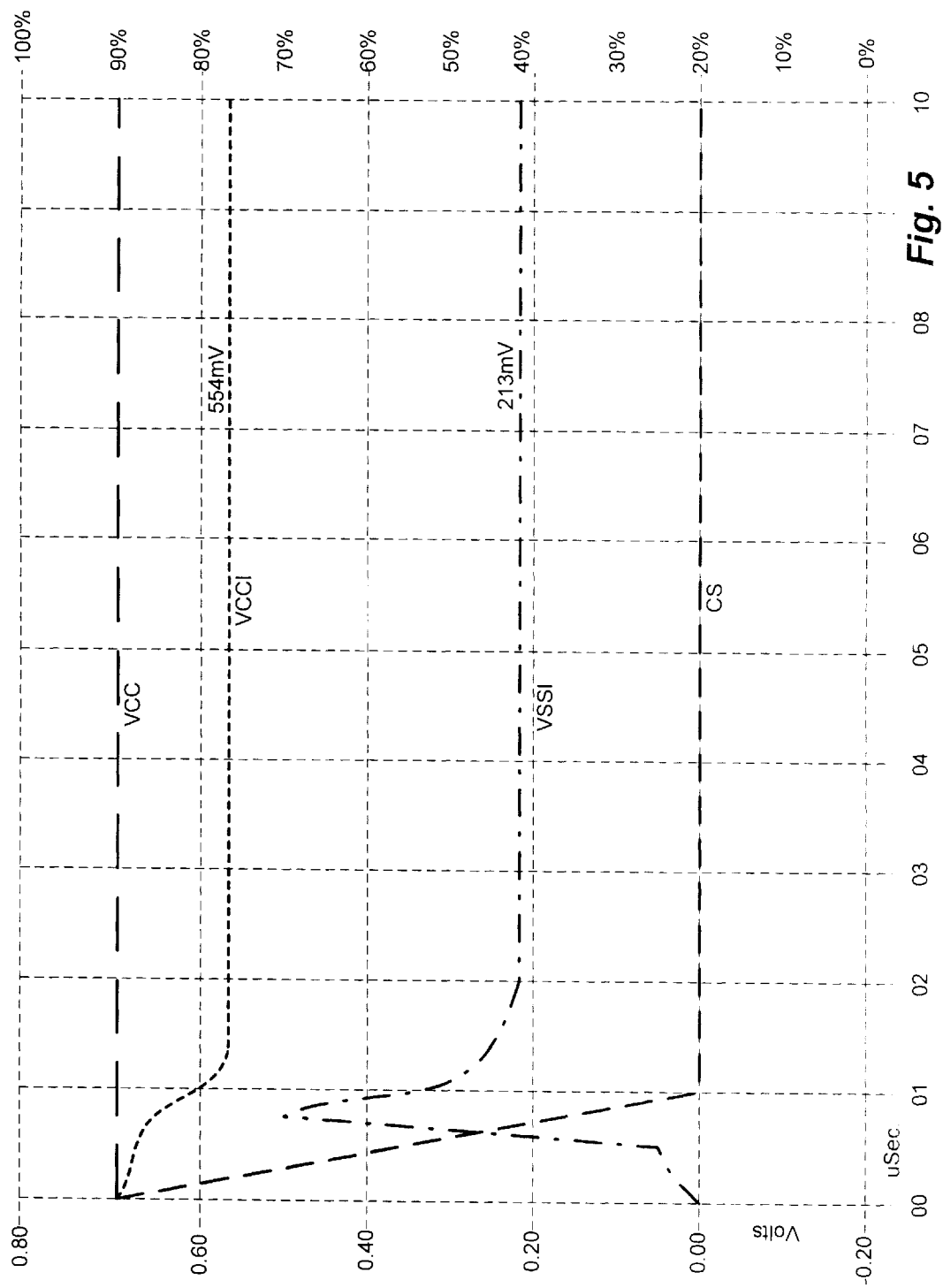
FIG. 5 is a plot of the voltages on the VCCI and VSSI nodes of the circuit of FIG. 4 in response to the assertion of the CS signal and its transitioning from a level of VCC to VSS and wherein the upper N-channel transistor body is tied to VCCI.

With reference additionally now to FIG. 5, a plot of the voltages on the VCCI and VSSI nodes 124 and 224 of the circuit of FIGS. 4 is shown in response to the assertion of the CS signal. In this illustrative situation, the body of the upper N-channel transistor 220 (FIG. 4) is tied to the VCCI node 216.

Upon assertion of the CS signal, it transitions from a VCC level of about 0.70 Volts to VSS (0.0 Volts). This causes the voltage on the VCCI node, which was at a level of VCC, to rapidly decrease to and maintain a level of approximately 554 mVolts at about 1.0 microseconds. Concurrently, the VSSI node first rises from the level of VSS to almost 0.50 Volts before maintaining a level of substantially 213 mvolts after about 2.0 microseconds.

While there have been described above the principles of the present invention in conjunction with specific circuitry and MOS transistor types, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit logic device having supply and reference voltage lines thereof, said device comprising:
   an internal supply voltage node selectively couplable to said supply voltage line in response to an input signal supplied to a gate terminal of a first MOS transistor, said first MOS transistor having a back gate coupled to said supply voltage line;
   an internal reference voltage node selectively couplable to said reference voltage line in response to a complement of said input signal supplied to a gate terminal of a second MOS transistor, said second MOS transistor having a back gate coupled to said reference voltage line;
   a third MOS transistor in parallel with said first MOS transistor between said supply voltage line and said internal supply voltage node, said third MOS transistor having a gate terminal coupled to said supply voltage line and a back gate coupled to said internal supply voltage node;

a fourth MOS transistor in parallel with said second MOS transistor between said reference voltage line and said internal reference voltage node, said fourth MOS transistor having a gate terminal coupled to said reference voltage line and a back gate coupled to said internal reference voltage node; and a logic circuit comprising a plurality of logic gates coupled between said internal supply voltage node and said internal reference voltage node.

2. The integrated circuit device of claim 1 wherein said first and fourth MOS transistors comprise P-channel devices.

3. The integrated circuit device of claim 1 wherein said second and third MOS transistors comprise N-channel devices.

4. The integrated circuit device of claim 1 wherein said first MOS transistor has a width/length ratio of substantial 2000μ/0.18μ.

5. The integrated circuit device of claim 1 wherein said second MOS transistor has a width/length ratio of substantially 1000μ/0.18μ.

6. The integrated circuit device of claim 1 wherein said third MOS transistor has a width/length ratio of substantially 10μ/0.18μ.

7. The integrated circuit device of claim 1 wherein said fourth MOS transistor has a width/length ratio of substantially 40μ/0.18μ.

8. An integrated circuit device comprising:

a plurality of logic gates coupled between an internal supply voltage node and an internal reference voltage node;

first and second parallel coupled MOS transistors coupling a supply voltage line to said internal supply voltage node;

third and fourth parallel coupled MOS transistors coupling a reference voltage line to said internal reference voltage node; and first and second complementary input lines respectively coupled to gate terminals of said first and third MOS transistors, gate terminals of said second and fourth MOS transistors being coupled to said supply voltage line and said reference voltage line respectively, wherein said second and fourth MOS transistors comprise back gates respectively coupled to said internal supply voltage node and said internal reference voltage node, and wherein said first and third MOS transistors comprise back gates respectively coupled to said supply voltage line and said reference voltage line respectively.

9. The integrated circuit device of claim 8 wherein said first and fourth MOS transistors comprise P-channel devices.

10. The integrated circuit device of claim 8 wherein said second and third MOS transistors comprise N-channel devices.

11. The integrated circuit device of claim 8 wherein said first MOS transistor has a width/length ratio of substantially 2000μ/0.18μ.

12. The integrated circuit device of claim 8 wherein said second MOS transistor has a width/length ratio of substantially 10μ/0.18μ.

13. The integrated circuit device of claim 8 wherein said third MOS transistor has a width/length ratio of substantially 1000μ/0.18μ.

14. The integrated circuit device of claim 8 wherein said fourth MOS transistor has a width/length ratio of substantially 40μ/0.18μ.

15. An integrated circuit device comprising:

a plurality of logic gates coupled between an internal supply voltage node and an internal reference voltage node;

a first MOS transistor coupling a supply voltage line to said internal supply voltage node, said first MOS transistor having a gate terminal coupled to receive a chip select signal and a back gate coupled to said supply voltage;

a second MOS transistor coupling a reference voltage line to said internal reference voltage node, said second MOS transistor having a gate terminal coupled to receive a complementary chip select signal and a back gate coupled to said reference voltage line;

third MOS transistor in parallel with said first MOS transistor, said third MOS transistor having a gate terminal coupled to said supply voltage line and a back gate coupled to said internal supply voltage line; and fourth MOS transistor in parallel with said second MOS transistor, said fourth MOS transistor having a gate terminal coupled to said reference voltage line and a back gate coupled to said internal reference voltage line.

16. The integrated circuit device of claim 15 wherein said first MOS transistor comprises a P-channel device.

17. The integrated circuit device of claim 15 wherein said first MOS transistor has a width/length ratio of substantially 2000μ/0.18μ.

18. The integrated circuit device of claim 15 wherein said second MOS transistor comprises an N-channel device.

19. The integrated circuit device of claim 15 wherein said second MOS transistor has a width/length ratio of substantially 1000μ/0.18μ.

20. The integrated circuit device of claim 15 wherein said third MOS transistor comprises an N-channel device.

21. The integrated circuit device of claim 15 wherein said third MOS transistor has a width/length ratio of substantially 10μ/0.18μ.

22. The integrated circuit device of claim 15 wherein said fourth MOS transistor comprises an P-channel device.

23. The integrated circuit device of claim 15 wherein said fourth MOS transistor has a width/length ratio of substantially 40μ/0.18μ.

* * * * *

UNITED STATES PATENT AND TRADEMARK OFFICE
CERTIFICATE OF CORRECTION

PATENT NO.   : 6,512,394 B1
DATED        : January 28, 2003
INVENTOR(S)  : Michael C. Parris It is certified that error appears in the above-identified patent and that said Letters Patent is hereby corrected as shown below:

<u>Column 7,</u>
Line 20, "substantial" should be -- substantially --

Signed and Sealed this

Seventeenth Day of June, 2003

JAMES E. ROGAN
*Director of the United States Patent and Trademark Office*